United States Patent
Haas et al.

(10) Patent No.: US 7,722,947 B2
(45) Date of Patent: May 25, 2010

(54) ORGANIC LIGHT-EMITTING DIODE COMPRISING A DOPED ORGANIC LAYER

(75) Inventors: Gunther Haas, Saint Gregoire (FR); Salvatore Cina, Rennes (FR)

(73) Assignee: Thomson Licensing, Boulogne-Billancourt (FR)

(*) Notice: Subject to any disclaimer, the term of this patent is extended or adjusted under 35 U.S.C. 154(b) by 768 days.

(21) Appl. No.: 11/628,294

(22) PCT Filed: May 31, 2005

(86) PCT No.: PCT/EP2005/052485
§ 371 (c)(1), (2), (4) Date: Nov. 30, 2006

(87) PCT Pub. No.: WO2005/119807
PCT Pub. Date: Dec. 15, 2005

(65) Prior Publication Data
US 2008/0145648 A1    Jun. 19, 2008

(30) Foreign Application Priority Data
Jun. 2, 2004  (FR) .................. 04 51091

(51) Int. Cl.
*H01L 51/30* (2006.01)
*H01L 51/05* (2006.01)
*H01L 51/50* (2006.01)
*H01L 51/52* (2006.01)

(52) U.S. Cl. .................. 428/332; 428/690; 428/419; 428/500

(58) Field of Classification Search ............ 428/332, 428/690, 419, 500
See application file for complete search history.

(56) References Cited

U.S. PATENT DOCUMENTS
2004/0095064 A1   5/2004   Lu

FOREIGN PATENT DOCUMENTS
| EP | 1376714 A2 | 1/2004 |
| EP | 1394870 A2 | 3/2004 |
| JP | 2001-023775 A | 1/2001 |
| WO | WO 03/107452 | 12/2003 |

OTHER PUBLICATIONS

X. Zhou et al: "Low-voltage inverted transparent vacuum deposited organic light-emitting diodes using electrical doping" Applied Physics Letters, AIP, American Institute of Physics, Melville, NY US, vol. 81, No. 5, Jul. 29, 2002, pp. 922-924.
M. Pfeiffer et al; "A Low Drive Voltage, Transparent, Metal-Free N-I-P Electrophorescent Light Emitting Diode" Organic Electronics, Elsevier, Amsterdam, NL, vol. 4, No. 1, Jun. 2003, pp. 21-26.
Search Report Dated Nov. 9, 2005.

*Primary Examiner*—Duc Truong
(74) *Attorney, Agent, or Firm*—Robert D. Shedd; Jeffrey M. Navon

(57) ABSTRACT

The invention relates to an organic light-emitting diode comprising, on a substrate, generally one lower electrode followed by a flat conductive organic layer a doped organic layer, upon which an organic light-emitting layer is placed, and an upper electrode, which is placed upon this organic light-emitting layer and which is essentially transparent to the light produced in the light-emitting layer. The lower electrode and the flat organic layer serve as a cathode. The doped layer makes it possible to use a hole-conductive material for the flat layer.

9 Claims, 1 Drawing Sheet

ORGANIC LIGHT-EMITTING DIODE COMPRISING A DOPED ORGANIC LAYER

Figure 1:
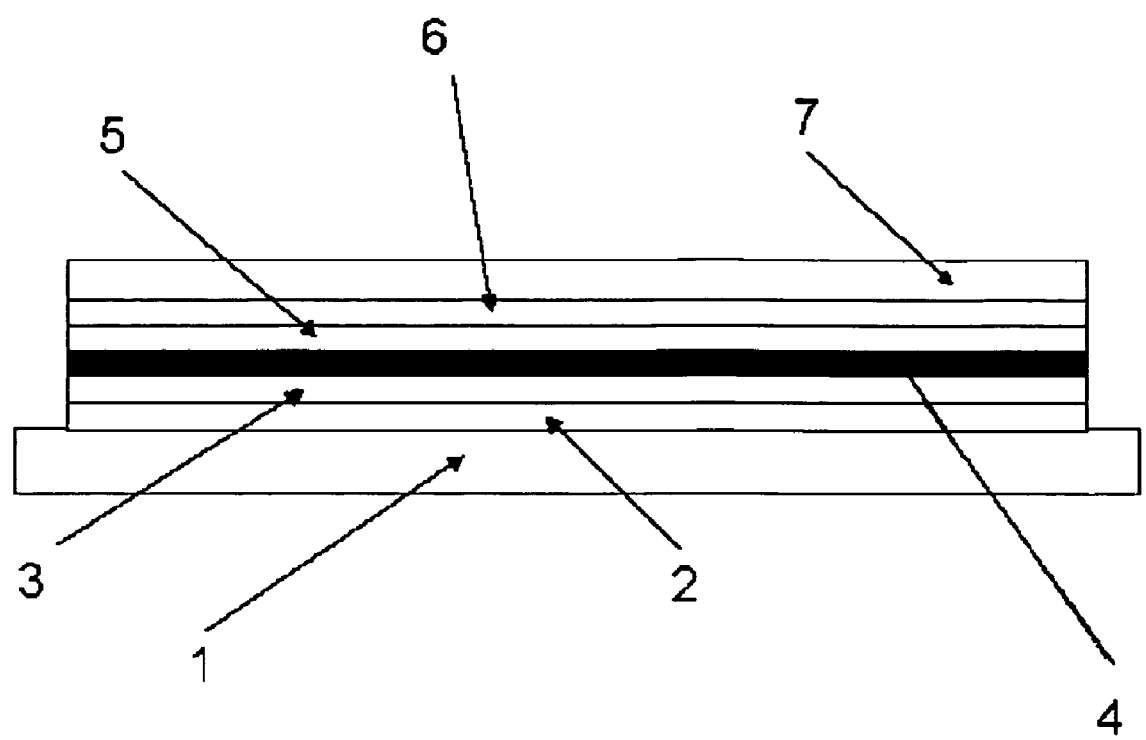

This application claims the benefit, under 35 U.S.C. §365of International Application PCT/EP05/052485, filed May 31, 2005, which was published in accordance with PCT Article 21(2) on Dec. 15, 2005 in French and which claims the benefit of French patent application No. 0451091, filed Jun. 2, 2004.

The invention relates to "top-emitting" OLEDs (organic light-emitting diodes) which comprise, between at least one of the electrodes and the organic electroluminescent layer placed between these electrodes, a doped organic layer.

In "top-emitting" diodes, the light emitted by the electroluminescent layer exits the diode on the opposite side from the substrate. The substrate is generally not transparent.

The prior art describes numerous organic light-emitting diode structures comprising, between cathode and anode, in the following order: an electron injection layer; an electron transport layer; the electroluminescent layer; a hole transport layer; and a hole injection layer. One or both of these injection or transport layers may be omitted.

It is known that such structures impose constraints on the choice of materials, especially according to the electron work function of the electrode material and the position of the HOMO (highest occupied molecular orbital) or LUMO (lowest unoccupied molecular orbital) energy levels of the electrons or holes for the organic materials of the layers inserted between these electrodes.

To avoid or limit such constraints, document WO 02/41414 teaches the use of doped organic layers between the electroluminescent layer and the electrodes. The doping of such layers is tailored so that the charges (holes or electrons) pass from the electrode into this doped layer by a tunnel effect. The use of such doped layers makes it possible to get round the problem of the work function of the electrode. It is then possible for example to use ITO (indium tin oxide) as cathode.

Document WO 03/083958 proposes the insertion of organic blocking layers (which block holes or electrons) between one or both of these doped organic layers and the electroluminescent layer. By adding blocking layers it is possible to better control the carriers in the electroluminescent layer itself, to limit nonradiative electron/hole recombinations and thus to increase the luminous efficiency.

Document U.S. Pat. No. 6,639,357 also describes such a structure comprising an n-doped conducting organic layer on the cathode side, which also serves as a hole-blocking layer.

Documents EP 0 498 979, EP 1 017 118, U.S. Pat. Nos. 6,013,384 and 6,433,355 also describe structures comprising doped organic layers.

In the fabrication of light-emitting diodes, planarity problems occur—it is known that residual reliefs of the substrate of a diode, especially if this substrate is an active matrix, and the reliefs of the lower electrode itself, which are usually generated by the method of deposition, pose problems for obtaining a sufficiently planar and uniformly thick electroluminescent layer.

In the case of conventional (noninverted) structures in which the anode is the lower electrode, it is known to insert a conducting organic planarizing layer between the anode and the electroluminescent layer. As conducting materials for this layer allowing the planarity of the substrate to be rectified, if possible to use in particular PEDOT (poly-3,4-ethylene dioxythiophene)/PSS (polystyrenesulfonate) blends, PANI (polyaniline)/PSS blends or blends of other organic conductive compounds such as aromatic amine derivatives. Document US 2003-0010959 illustrates such a structure. The document "High-Resistivity PEDT/PSS for reduced crosstalk in passive matrix OELs" by A. Elschner and F. Jonas, published on the occasion of the Asia Display/IDW'01 Conference, pp. 1427 to 1430 of the compendium of this conference, illustrates the planarizing function of this layer. According to the prior art, such conducting organic materials are always used on the anode side, as hole transport layer, generally combined with a hole injection layer. This is because the electron work function of these materials is reputed to be too high for them to be able to be used on the cathode side, as electron injection layer.

Document US 2004/095064 describes the use of PEDOT/PSS for forming a layer serving both for hole injection and hole transport, on the anode electrode side (see especially the end of §8), that is to say on the substrate side. A p-doped organic layer may be added for hole transport between this PEDOT/PSS layer and the electroluminescent layer, for example, one based on m-MTDATA p-doped with F4-TCNQ (see §27). On the cathode side, it is possible to use an n-doped layer for electron transport, for example a layer made of lithium-doped BPhen (see §29).

The article entitled "Opposing influence of hole blocking layer and a doped transport layer on the performance of heterostructure OLEDs", published in Dec. 2003 by M. Ben Khalifa, D. Vaufrey and J. Tardy in the Journal "Organic Electronics", Vol. 5, No. 4, pp. 187-198, also describes diodes having the following structures:

- p. 193, §3.2, device 3: substrate/ITO (anode)/PEDOT-PSS (hole injection)/TPD p-doped with F4-TCNQ/Alq3 (electroluminescent and electron-injection layer)/MgAg (cathode)
- p. 195, §3.4, end of $1^{st}$ paragraph: substrate/ITO (anode)/PEDOT-PSS (hole injection)/TPD p-doped with F4-TCNQ/DCM with Alq/BCP with tBu-PBD/PBD with 5% Alq/MgAg (cathode).

In inverted structures of organic light-emitting diodes in which the cathode is the lower electrode, the planarity problem of the lower layers is not solved at the present time in a simple manner.

The object of the invention is to propose inverted organic light-emitting diode structures, in which the cathode is the lower electrode, which allow the abovementioned planarity problem to be solved in a simple manner.

For this purpose, the subject of the invention is an organic light emitting diode (OLED) comprising, on a substrate, a doped organic layer, surmounted by an organic electroluminescent layer, which is itself surmounted by at least one electrode called the upper electrode, which is substantially transparent to the light produced in the electroluminescent layer, characterized in that it includes a conducting organic layer called a planarizing layer inserted between the substrate and said doped organic layer.

Preferably, the conducting organic planarizing layer serves to inject electrons into said electroluminescent layer, and the doped organic layer is then n-doped. This conducting organic planarizing layer then serves as cathode. If a lower electrode is inserted between the substrate and the planarizing layer, this lower electrode therefore also serves as cathode in combination with the conducting organic layer.

The n-doping of a material consists in inserting electron-donor atoms or molecules into this material in a manner suitable for increasing the conductivity of this material, preferably by a factor of greater than 100. This is achieved in a manner known per se by chemically modifying the base material of this layer (for example by the grafting of suitable radicals), or by incorporating other suitable compounds with concentrations generally between 1 per 10000 and 1 per 100.

The invention applies most particularly to cases in which the electron work function of the organic material of the conducting planarizing layer is greater than 3.5 eV. This is because, by overlapping, according to the invention, the conducting organic layer having a high work function, and therefore one reputed to be able to transport exclusively holes, with an n-doped organic layer on the cathode side, this high work function no longer prevents the conduction of electrons. Nothing therefore now prevents using this organic layer with a high work function to improve the planarity on the cathode side.

According to a preferred embodiment, an electrode called the lower electrode is inserted between the substrate and the conducting organic planarizing layer, thereby making it possible for the electrical current to be distributed more uniformly over the entire active surface of the diode. The material of this lower electrode is, for example, a metal or a conducting oxide. This lower electrode preferably has a surface conductivity greater than that of the organic planarizing layer, preferably at least 100 times higher.

Preferably, the lower electrode is reflective. This makes it possible to reflect the light produced by the electroluminescent layer onto the transparent upper electrode, and thus to increase the extraction yield of the light produced. The material of this lower electrode is then preferably metallic. For example, it is chosen to be aluminum, chromium or silver.

In the absence of an electrode inserted between the substrate and the planarizing layer, it is this organic planarizing layer that is conducting and that serves as electrode. Organic electrodes are for example described in documents EP 0 727 100 and U.S. Pat. No. 6,586,764 (Philips).

The term "conducting organic layer" is understood to mean a layer whose perpendicular conductivity is at least $10^{-5}$ S/cm. The base material of the doped organic layer is a semiconductor and therefore has an energy gap between the highest occupied molecular orbital (HOMO) and the lowest unoccupied molecular orbital (LUMO) levels.

The nature and the concentration of the dopant of the doped organic layer are adapted in a manner known per se in order to obtain the electrical conductivity needed to limit the height of the potential barrier between the lower electrode and this layer, so as to allow the electrons to pass at this interface by a tunnel effect. In practice, for this purpose the base material of the organic layer should preferably be doped so as to increase its initial intrinsic conductivity by a factor of more than $10^2$.

Without departing from the invention, other organic layers may be inserted into the structure of this diode:
- between the doped organic layer and the electroluminescent layer, such as a carrier blocking layer, which blocks holes when the lower electrode is a cathode; and
- between the electroluminescent layer and the upper electrode, such as an injection layer and, optionally, a carrier transport layer (for transporting holes when the upper electrode is an anode), a carrier blocking layer (blocking electrons when the upper electrode is an anode) or, instead of these injection and transport layers, a second doped organic layer (p-doped when the upper electrode is an anode).

Preferably, the mean thickness of the conducting organic planarizing layer is at least 50 nm. Thanks to the relatively large thickness of this layer, and above all because of the possibility of applying it in the liquid state, it is possible to rectify the planarity defects of the substrate provided with the lower electrode.

Preferably, the organic material of the conducting planarizing layer comprises at least one polymer chosen from the group formed by polythiophenes, polypyrrols, polyamines, polyanilines (PANI) and polyacetylenes, and also blends thereof. This polymer may be blended with other polymers not forming part of this group.

Preferably, the organic material of the conducting planarizing layer is chosen from the group formed by PEDT (polyethylene dioxythiophene)/PSS (polystyrenesulfonate) blends, more especially PEDOT (poly-3,4-ethylene dioxythiophene)/PSS (polystyrenesulfonate) blends, PANI (polyaniline)/PSS (polystyrenesulfonate) blends and TTA-DNPB (bis(N,N'-I-naphthylphenylaminobiphenyl)trityl aniline).

Finally, the subject of the invention is also an organic light-emitting diode (OLED) display, characterized in that it comprises a set of diodes (OLEDs) according to the invention. Such a display is advantageously used for displaying images.

The invention will be more clearly understood on reading the description that follows, given by way of nonlimiting example and with reference to the appended FIG. 1, which illustrates schematically an organic diode according to one embodiment of the invention.

A process for producing a display comprising an array of light-emitting diodes according to the invention, having an inverted structure, that is to say one in which the rear or lower electrode of each diode is a cathode, will now be described.

The process starts with a substrate 1, generally a glass plate coated with a silicon layer, in which electrodes and the circuits of an active matrix have been etched. There therefore emerges, from this layer, at the implantation of each diode of the display, an electrode, here a cathode, for supplying this diode. Each cathode is connected in series to a current modulator etched in the silicon layer. This modulator allows the diode deposited on this cathode to be controlled. The modulators themselves are controlled by pixel circuits that can be driven by arrays of electrodes (scanning electrodes and data electrodes) which are etched in or beneath the silicon layer.

The cathodes, which form the layer 2 of lower electrodes, are generally metallic and preferably reflective. Any reflective metal, such as for example Al, Cr or Ag, is chosen.

To protect this metal from oxidation during the subsequent deposition of the electrically conducting organic planarizing layer, it may be precoated with a protective conducting layer, for example made of ITO (Indium Tin Oxide) or another conducting oxide. Preferably, this protective layer is treated using an oxygen plasma in order to improve its "wetting" properties and its electronic properties.

Next, a conducting organic layer 3 consisting of a PEDOT/PSS blend is deposited using a liquid application method. The well-known advantage of PEDOT/PSS blends is that they can be applied in solution, thereby making the application much easier and promoting the desired planarizing effect. After application, the solvent is evaporated. The conducting organic layer of the diode according to the invention is thus obtained. The composition and the thickness of this layer are adapted in a manner known per se so as to obtain a transverse electrical conductivity (or conductivity perpendicular to the plane of this layer) of at least $10^{-3}$ S/cm.

The thickness of the cathodes, including where appropriate the intermediate protective conducting layer, is adapted in a manner known per se so that the surface conductivity of these cathodes is greater, preferably by at least 100 times, that of the conducting organic layer 3. The mean thickness of this layer 3 is between 5 and 400 nm, preferably at least 50 nm, especially so as to obtain a good planarity improvement effect.

Whereas the organic conducting layer 3 made of PEDOT/PSS that has just been deposited is reputed to be adapted more for transporting holes to inject and then transport electrons right to the electroluminescent layer, an n-doped organic layer 4 is then applied, such as that described for example in the abovementioned documents WO 02/41414 and WO 03/083958. Consequently, the relationship between the work function of the subjacent (cathode/PEDOT-PSS layer) assembly and the energy levels of the n-doped organic material 4 no longer has any major effect on the charge injection properties, and the PEDOT/PSS layer becomes effective for injecting electrons into the electroluminescent layer (which is deposited subsequently). In the absence of this doped organic layer, there would be a high barrier for electron transfer from the PEDOT/PSS layer into the electroluminescent layer and a diode having a poor yield would result.

Many n-doped organic materials may be used for this organic layer 4, for example Bphen or Alq3 doped with an alkali metal such as Li or Cs, or doped with an electron-donor molecule or organic radical, the HOMO (or donor) level of which is preferably close (to within ±0.5 eV) to the LUMO (or acceptor) level of said material.

The fabrication of the display then continues is manner known per se by:
- the application of an organic electroluminescent layer 5;
- the deposition of a p-doped organic layer 6 suitable for the injection and transport of holes;
- the deposition of an anode 7, here common with all the diodes of the display; and
- the deposition of a transparent encapsulation layer (not shown) for protecting the diodes from deterioration by oxygen or moisture.

The materials and the thickness of these layers are known per se, as are the deposition methods. They are therefore not described in detail.

An image display from an array of diodes according to the invention is obtained. The diodes of this display have uniform characteristics and a good yield thanks, in particular, to the planarity improvement layer 3 that also serves for injecting electrons.

According to a variant, a hole blocking layer is interposed between the n-doped organic layer 4 and the electroluminescent layer 5.

According to another variant, an electron blocking layer is interposed between the electroluminescent layer 5 and the p-doped organic layer 6.

According to another variant, the p-doped organic layer 6 is replaced with an organic hole injection layer and a hole transport layer.

The invention claimed is:

1. An organic light-emitting diode (OLED) comprising, on a substrate (1), a conducting organic layer (3) adapted to rectify planarity defects of this substrate and therefore called a planarizing layer, surmounted by a n-doped organic layer (4), which is itself surmounted by an organic electroluminescent layer (5), which is itself surmounted by at least one electrode called the upper electrode (7) which is substantially transparent to the light produced in the electroluminescent layer (5), wherein said conducting organic planarizing layer (3) is made of an organic material having an electron work function greater than 3.5 eV but serves for injecting electrons into said electroluminescent layer (5) and wherein said upper electrode (7) serves for bring holes into said electroluminescent layer (5).

2. The diode as claimed in claim 1, wherein it includes an electrode called the lower electrode (2) inserted between said substrate and said conducting organic planarizing layer.

3. The diode as claimed in claim 2, wherein said lower electrode has a surface conductivity greater than that of the conducting organic planarizing layer.

4. The diode as claimed in claim 2, wherein the lower electrode is reflective.

5. The diode as claimed in claim 4, wherein the material of the lower electrode is metallic.

6. The diode as claimed in claim 1, wherein the mean thickness of the conducting organic planarizing layer is at least 50 nm.

7. The diode as claimed in claim 1, wherein the organic material of said conducting planarizing layer comprises at least one polymer chosen from the group formed by polythiophenes, polypyrrols, polyamines, polyanilines (PANI) and polyacetylenes, and also blends thereof.

8. The diode as claimed in claim 6, wherein the organic material of said conducting planarizing layer is chosen from the group formed by PEDT (polyethylene dioxythiophene)/PSS (polystyrenesulfonate) blends, more especially PEDOT (poly-3,4-ethylene dioxythiophene)/PSS (polystyrenesulfonate) blends, PANI (polyaniline)/PSS (polystyrenesulfonate) blends and TTA-DNPB (bis(N,N'-I-naphthylphenylaminobiphenyl) trityl aniline).

9. An organic light-emitting diode (OLED) display, wherein it comprises a set of diodes as claimed in claim 1.

* * * * *